United States Patent
Nguyen et al.

(10) Patent No.: US 9,542,982 B1
(45) Date of Patent: Jan. 10, 2017

(54) SYSTEMS AND METHODS FOR PROCESSING DATA WITH POWER RAMP CONTROL

(71) Applicant: Avago Technologies General IP (Singapore) Pte. Ltd., Singapore (SG)

(72) Inventors: Kaitlyn T. Nguyen, San Jose, CA (US); Shaohua Yang, San Jose, CA (US); Dan Liu, Shanghai (CN); Xiao Dong Yan, Shanghai (CN); Qi Zuo, Shanghai (CN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/965,872

(22) Filed: Dec. 10, 2015

(51) Int. Cl.
*G11C 7/00* (2006.01)
*G11C 7/12* (2006.01)
*G11C 8/10* (2006.01)
*G11C 7/14* (2006.01)
*G11C 5/14* (2006.01)

(52) U.S. Cl.
CPC ............. *G11C 7/12* (2013.01); *G11C 5/148* (2013.01); *G11C 7/14* (2013.01); *G11C 8/10* (2013.01)

(58) Field of Classification Search
CPC ............. G11C 7/12; G11C 5/148; G11C 7/14; G11C 8/10
USPC ........................ 365/189.11, 189.011, 189.17, 189.05,365/221, 220, 228, 226, 233.1, 2, 33.112, 239,365/240
See application file for complete search history.

(56) References Cited

U.S. PATENT DOCUMENTS

| 7,685,451 | B2 | 3/2010 | Burns et al. |
| 8,555,131 | B2 | 10/2013 | Rault |
| 9,009,552 | B2 * | 4/2015 | Kwan .............. G01R 31/31857 714/726 |
| 9,134,788 | B2 | 9/2015 | Suryanarayanan et al. |

* cited by examiner

*Primary Examiner* — Fernando Hidalgo

(57) ABSTRACT

An apparatus for processing data includes a data processing circuit configured to process user data, wherein the data processing circuit comprises a number of sub-circuits, a number of clock gates each configured to control a clock signal to one of the sub-circuits, a gating control circuit configured to control the clock gates to apply the clock signal to each of the sub-circuits in staged fashion during a ramped power up operation, and a dummy data source configured to provide dummy data to the data processing circuit during the ramped power up operation of the data processing circuit.

11 Claims, 7 Drawing Sheets

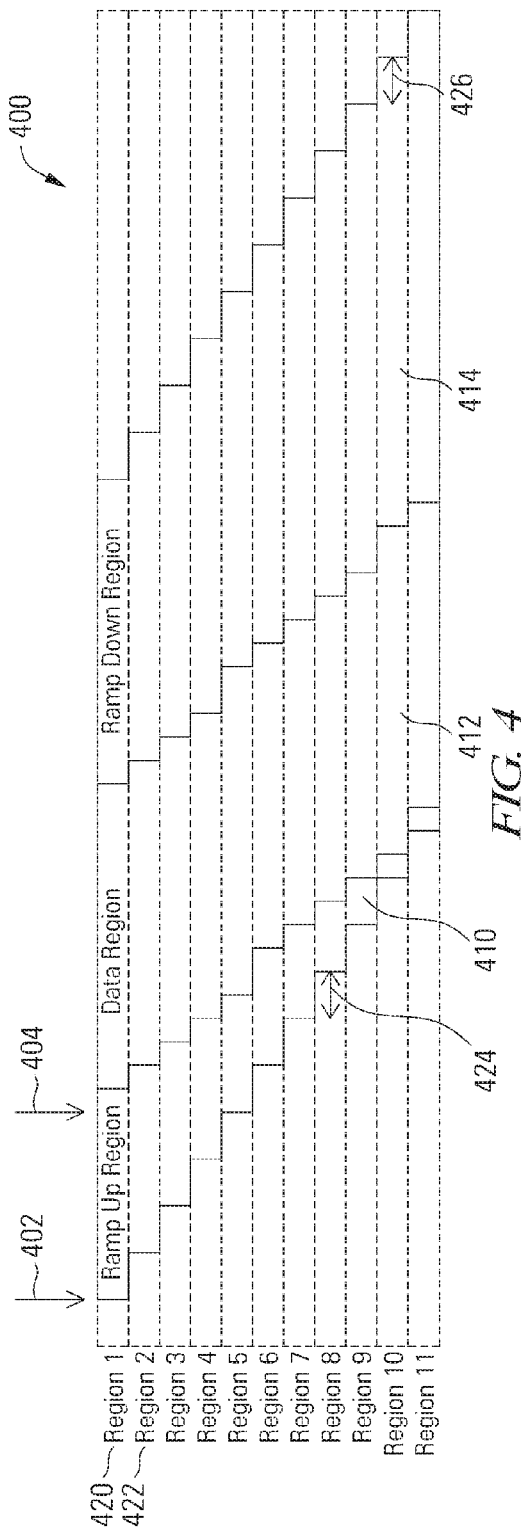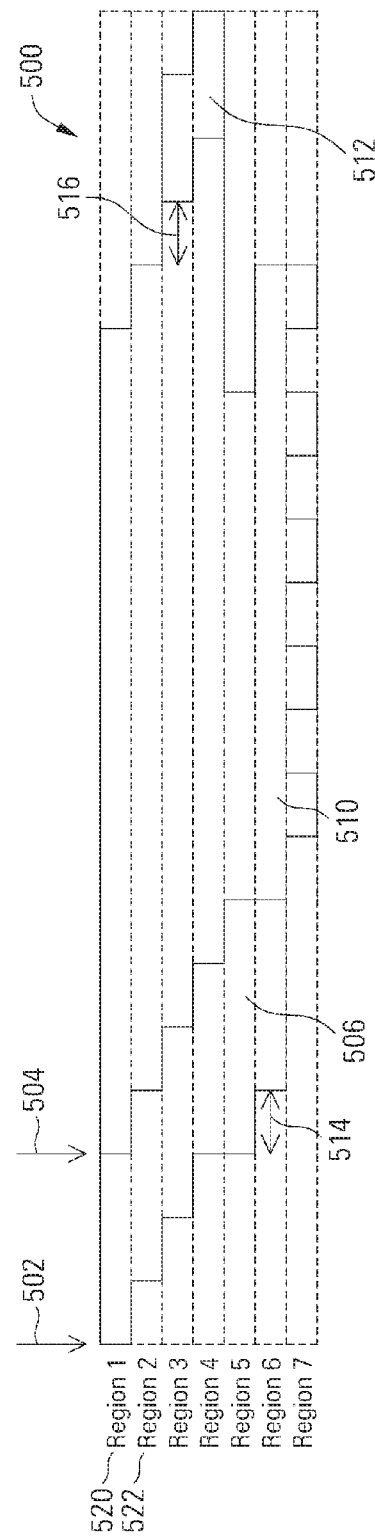

SYSTEMS AND METHODS FOR PROCESSING DATA WITH POWER RAMP CONTROL

FIELD OF THE INVENTION

Various embodiments of the present invention provide systems and methods for processing data, and more particularly to systems and methods for ramping power up and down in a detector and decoder.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, parity bits can be added to groups of data bits, ensuring that the groups of data bits (including the parity bits) have either even or odd numbers of ones. The parity bits can be used in error correction systems, including in low density parity check (LDPC) decoders. Data detectors can be used in conjunction with data decoders to identify the values of data bits and to correct errors in those values.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

FIG. 4 depicts power ramp up and ramp down for a data detector divided into a number of logic regions in accordance with one or more embodiments of the present invention;

FIG. 5 depicts power ramp up and ramp down for a data decoder divided into a number of logic regions in accordance with one or more embodiments of the present invention;

DETAILED DESCRIPTION OF THE INVENTION

Embodiments of the present invention are related to power ramp control in elements of a data processing system, and specifically in some embodiments, controlling power ramp up and ramp down in a data detector and in a data decoder. Power ramp control in a data processing system as disclosed herein is not limited to use with any particular storage system or transmission system. Power ramp control as disclosed herein is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Power ramp control can be applied to one or more elements of a data processing system such as, but not limited to, a data detector and a data decoder. Power consumption in the data detector and a data decoder are ramped up and down to prevent transient IR voltage drops that would otherwise occur when the data detector and data decoder are instantly turned on. By ramping power consumption up and down in the data detector and data decoder, the pin voltage supply can be lowered, reducing overall power, because IR drops and transients are reduced and the need for a higher pin voltage supply to compensate for the IR drops and transients is reduced as a result. Thus, by ramping power consumption up and down in the data detector and data decoder, power requirements in the system are relaxed without impacting performance.

In some embodiments, power is ramped up in the data detector and/or data decoder by gating clock signals to different regions in the data detector and data decoder at staggered intervals, while providing dummy data with toggling or alternating data values to the data detector and data decoder. Each region of the data detector and data decoder is thus activated at a different time, while the toggling data values effectively cause the power to be turned on in each region when its clock signal or signals are enabled. Similarly, power is ramped down in the data detector and/or data decoder by gating clock signals off from different regions in the data detector and data decoder at staggered intervals. In some embodiments, dummy data with toggling or alternating data values can be provided to the data detector and data decoder to be processed as power is ramped down. In some other embodiments, user data that was processed in the data detector and data decoder can continue to be processed as power is ramped down.

Figure 1:
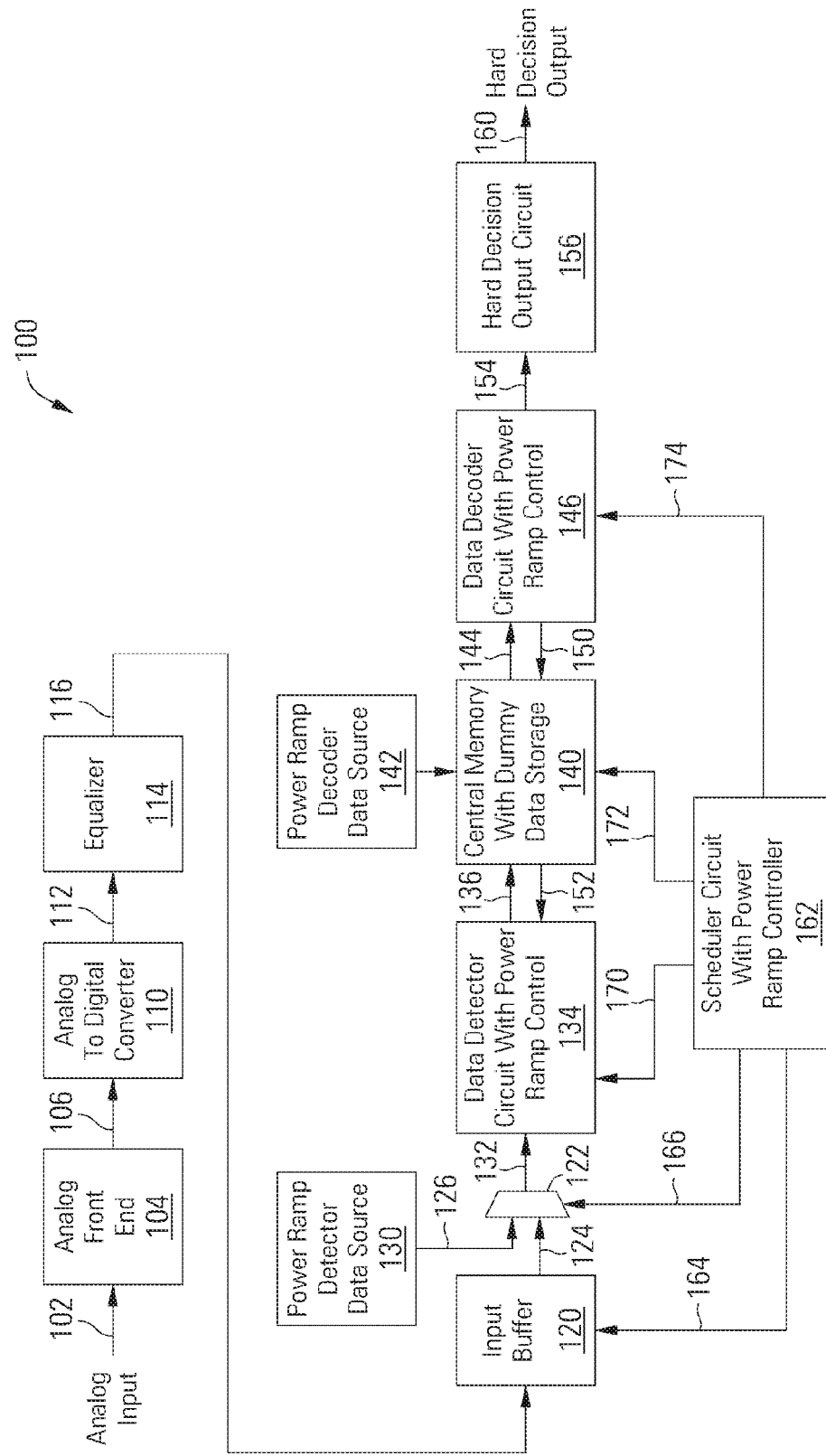
FIG. 1 depicts a read channel including a data detector and data decoder with power ramp control in accordance with one or more embodiments of the present invention.

Turning to FIG. 1, a read channel 100 including a data detector 134 and data decoder 146 with power ramp control is depicted in accordance with one or more embodiments of the present invention. An analog signal representing data to be processed is received from analog input 102 by an analog front end 104 that receives stored or transmitted encoded information. Analog front end 104 processes the signal from analog input 102 and provides a processed analog signal 106 to an analog to digital converter 110. Analog front end 104 may include, but is not limited to, an analog filter and an amplifier circuit as are known in the art. Based upon the disclosure provided herein, one of ordinary skill in the art will recognize a variety of circuitry that may be included as part of analog front end 104. In some cases, analog input 102 is derived from a read/write head assembly that is disposed in relation to a storage medium. In other cases, analog input 102 is derived from a receiver circuit that is operable to receive a signal from a transmission medium, either wired or wireless. Based upon the disclosure provided herein, one of ordinary skill in the art will recognize a variety of source from which analog input 102 may be derived.

Analog to digital converter 110 converts processed analog signal 106 into a corresponding series of digital samples 112. Analog to digital converter 110 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 112 are provided to an equalizer circuit 114. Equalizer circuit 114 applies an equalization algorithm to digital samples 112 to yield an equalized output 116. In some embodiments of the present invention, equalizer circuit 114 is a digital finite impulse response (DFIR) filter circuit as are known in the art. It may be possible that equalized output 116 may be received directly from a storage device in, for example, a solid state storage system. In such cases, analog front end 104, analog to digital converter 110 and equalizer circuit 114 can be omitted where the data is received as a digital data input. Equalized output 116 is stored in an input buffer 120 that includes sufficient memory to maintain one or more codewords until processing of that codeword is completed through a data detector circuit 134 and a data decoder circuit 146 including, where warranted, multiple global iterations (processing passes through both data detector circuit 134 and data decoder circuit 146) and/or local iterations (processing passes through data decoder circuit 146 during a given global iteration).

Stored data sectors or other data blocks 124 from input buffer 120 are provided to data detector circuit 134, which is operable to apply a data detection algorithm to a received sector or codeword. In some embodiments of the present invention, data detector circuit 424 is a maximum a posteriori (MAP) data detector circuit as are known in the art. In other embodiments of the present invention, data detector circuit 134 is a Viterbi algorithm data detector circuit as are known in the art. Of note, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Also, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Based upon the disclosure provided herein, one of ordinary skill in the art will recognize a variety of data detector circuits that may be used in relation to different embodiments of the present invention.

Before the data detector circuit 134 processes a data block 124 from input buffer 120, it is powered up in ramped fashion. A number of logic regions or sub-circuits in the data detector circuit 134 are powered up in staged fashion one by one so that the power consumption in the data detector circuit 134 does not immediately jump, causing IR voltage drops and transients in the power supply voltage. In some embodiments, the logic regions are powered up in staged fashion by gating off the clock signal to flip flops in the data detector circuit 134 region by region, enabling the clock signal to each logic region at a different time.

In order to cause power to be turned on or consumed in each logic region when its clock signal is enabled, dummy data with toggling or alternating values are provided to the data detector circuit 134 during the power ramp up. A multiplexer 122 can be used to select dummy data 126 from a power ramp detector data source 130 as the detector input 132 during the power ramp up, and to select the data sector 124 to be processed as the detector input 132 after the power ramp up is complete. The power ramp detector data source 130 can be any data source suitable for providing toggling data values, such as, but not limited to, a linear feedback shift register (LFSR) circuit. Based upon the disclosure provided herein, one of ordinary skill in the art will recognize a variety of circuitry that may be included as part of power ramp detector data source 130.

Upon completion of application of the data detection algorithm to the received data sector 124, data detector circuit 134 provides a detector output 136. Power in the data detector circuit 134 can then be ramped down if another data sector is not immediately available for processing. As when ramping power up in the data detector circuit 134, power can be ramped down by disabling the clock signal to each of the logic regions in the data detector circuit 134 one by one in staged fashion. The data detector circuit 134 can again process dummy data 126 during power ramp down, or can continue to process the previous data sector in some embodiments if the maximum transition run encoding of the data sector causes data values that alternate from bit to bit regularly enough to yield the desired ramped drop in the power consumption.

Detector output 136 can include hard decisions, soft information or both in various embodiments. As used herein, the phrase "soft information" is used in its broadest sense to mean reliability data with each instance of the reliability data indicating a likelihood that the value of a corresponding bit position or group of bit positions has been correctly detected. In some embodiments of the present invention, the soft information or reliability data is log likelihood ratio data as is known in the art. Detected output 136 is stored in central memory circuit 140.

Prior to decoding a previously stored sector from central memory circuit 140 in data decoder circuit 146, the data decoder circuit 146 is powered up in ramped fashion unless successive data sectors are available for decoding without pause. A number of logic regions in the data decoder circuit 146 are powered up in staged fashion one by one so that the power consumption in the data decoder circuit 146 does not immediately jump, causing IR voltage drops and transients in the power supply voltage. In some embodiments, the logic regions are powered up in staged fashion by gating off the clock signal to flip flops in the data decoder circuit 146 region by region, enabling the clock signal to each logic region at a different time.

In order to cause power to be turned on or consumed in each logic region when its clock signal is enabled, dummy data with toggling or alternating values are provided to the data decoder circuit 146 during the power ramp up. In some embodiments, the data decoder circuit 146 processes sections of a data sector in groups, for example according to portions of a parity check matrix. In some embodiments, dummy data with toggling or alternating data values is stored in a dedicated location of the central memory 140, for example during system initialization. Dummy data can be provided to central memory 140 from a power ramp decoder data source 142, which can include any suitable circuitry for providing toggling data values to be stored in the dummy data location of the central memory circuit 140, such as, but not limited to, a linear feedback shift register. During the power ramp up, the data decoder circuit 146 reads the dummy data from the central memory 140. Once the data decoder circuit 146 has been fully powered up, i.e., the clock signal to all logic regions of the data decoder circuit 146 have been enabled, the data decoder circuit 146 reads the previously stored data sector to be decoded from central memory circuit 140.

Upon completion of application of the data decoding algorithm to the stored data sector 144, data decoder circuit 146 provides a hard decision decoder output 154 and soft information decoder output 150 used to guide the data detector circuit 134 in subsequent global processing iterations. Power in the data decoder circuit 146 can then be ramped down if another data sector is not immediately available for processing. As when ramping power up in the data decoder circuit 146, power can be ramped down by disabling the clock signal to each of the logic regions in the data decoder circuit 146 one by one in staged fashion. The data decoder circuit 146 can again process dummy data from central memory 140 during power ramp down, or can continue to process the previous data sector in some embodiments.

In some embodiments of the present invention, the data decoder circuit 146 is a low density parity check (LDPC) decoder as are known in the art. Based upon the disclosure provided herein, one of ordinary skill in the art will recognize other decoders that can be used in relation to different embodiments of the present invention. The data decoder circuit 146 operates in some embodiments in iterative fashion, applying the decode algorithm to a data sector in repeated local decoding iterations within the data decoder circuit 146 until either a maximum number of local iterations is reached or until the codeword converges, measured in some embodiments by the number of unsatisfied parity checks.

Where the data fails to converge in the data decoder circuit 146 and the number of local iterations reaches a threshold, the resulting decoder output 150 is stored in central memory circuit 140 to await another global iteration through data detector circuit 134. When the data detector circuit 134 becomes available, a previously stored sector 152 that was previously processed in data decoder circuit 146 is retrieved from central memory circuit 140 by data detector circuit 134 where it is used to guide subsequent detection of the corresponding sector in input buffer 120.

Alternatively, where the data converges in the data decoder circuit 146, the resulting decoded output is provided as a hard decision decoder output 154 to a hard decision output circuit 156. Hard decision output circuit 156 is operable in some embodiments to assemble decoded data sectors into data tracks or otherwise processed. The hard decision output 160 can then be used in any suitable manner, such as providing it to a hard disk controller circuit that requested the data be read.

A scheduler circuit 162 controls the application of the data detection algorithm to data sectors by the data detector circuit 134 and of the data decode algorithm to data sectors by the data decoder circuit 146. In some embodiments, the scheduler circuit 162 also controls the power ramp up and ramp down operations in the data detector circuit 134 and the data decoder circuit 146. In other embodiments, power ramping is controlled by power ramp control circuits in the data detector circuit 134 and the data decoder circuit 146 or external to the data detector circuit 134 and the data decoder circuit 146. In cases in which the scheduler circuit 162 controls power ramping as well as detection and decoding iterations in the read channel 100, control signals 164, 166, 170, 172, 174 from scheduler circuit 162 to the input buffer 120, multiplexer 122, data detector circuit 134, central memory 140 and data decoder circuit 146 can be used to control the flow and scheduling of data in the read channel 100 as well as power ramping up and down in the data detector circuit 134 and the data decoder circuit 146.

In some embodiments, programmable registers are provided in the scheduler circuit 162 or elsewhere in the read channel 100, controlling the rate at which power is ramped up and down in each of the data detector circuit 134 and the data decoder circuit 146. The scheduler circuit 162 can be implemented in any suitable circuit to monitor and control the detection/decoding process and to control power ramping up and down in the data detector circuit 134 and the data decoder circuit 146. For example, scheduler circuit 444 can be implemented in dedicated logic circuits, state machines, microcontrollers, microprocessors, etc. Based upon the disclosure provided herein, one of ordinary skill in the art will recognize a variety of scheduler circuits that may be used in relation to different embodiments of the present invention.

Figure 2:
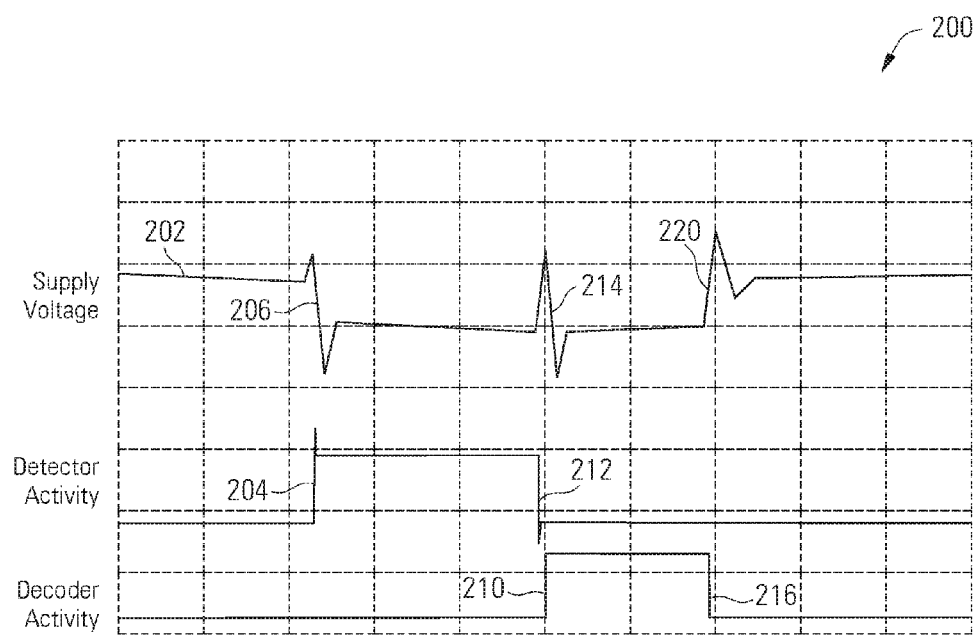
FIG. 2 depicts a plot of power supply voltage and activity for a data detector and data decoder.

Turning to FIG. 2, a plot 200 depicts power supply voltage and activity for a data detector and data decoder in which power ramping has not been enabled. The supply voltage 202 for the data detector and data decoder, which should ideally remain roughly constant, shows an IR drop and transient 206 when the detector becomes active or is turned on at point 204, a transient 214 when the detector is turned off at point 212 and the decoder is turned on at point 210, and an IR increase and transient 220 when the decoder is turned off at point 216. By ramping the power up and down gradually in the detector and decoder such IR drops and transients 206, 214, 220 can be substantially reduced.

Figure 3:
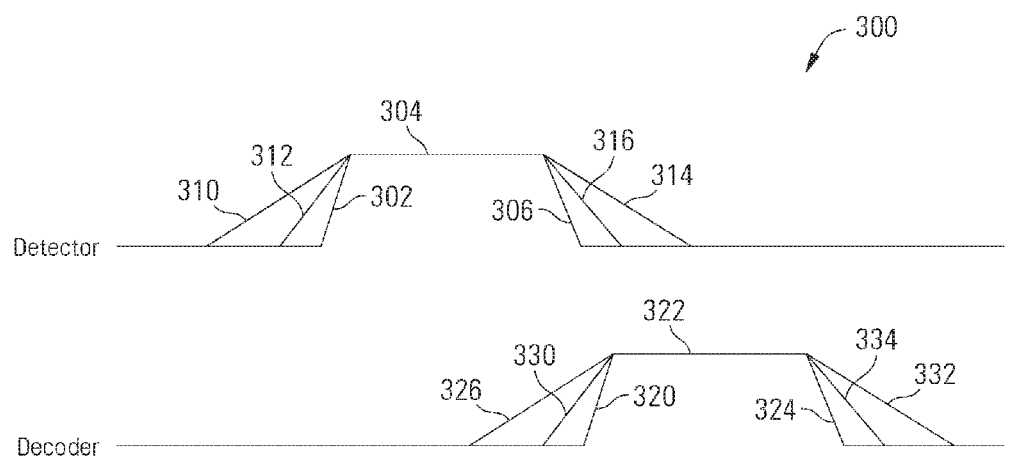
FIG. 3 depicts a plot of power consumption in a data detector and a data decoder with different power ramping rates in accordance with one or more embodiments of the present invention.

Turning to FIG. 3, a plot 300 depicts power consumption in a data detector and a data decoder with different power ramping rates in accordance with one or more embodiments of the present invention. The power consumption in the detector rises at a rapid rate 302 from an inactive or off level to an active level 304 and falls at a rapid rate 306 after processing. Power on ramping can be controlled so that power consumption in the detector ramps up at desired rates (e.g., 310, 312). Power off ramping can also be controlled so that power consumption in the detector ramps down at desired rates (e.g., 314, 316). The power ramp on and ramp off rates can be programmably set in some embodiments by setting the number of clock cycles or the time duration between enabling of clock signals to each successive logic region in the detector. In some embodiments, power ramping can also be programmably disabled in the detector.

Similarly, the power consumption in the decoder rises at a rapid rate 320 from an inactive or off level to an active level 322 and falls at a rapid rate 324 after processing. Power on ramping can be controlled so that power consumption in the decoder ramps up at desired rates (e.g., 326, 330). Power off ramping can also be controlled so that power consumption in the decoder ramps down at desired rates (e.g., 332, 334). The power ramp on and ramp off rates can be programmably set in some embodiments by setting the number of clock cycles or the time duration between enabling of clock signals to each successive logic region in the decoder. In some embodiments, power ramping can also be programmably disabled in the decoder.

Turning to FIG. 4, an example power ramp up and ramp down for a data detector that is divided into a number of logic regions is depicted in accordance with one or more embodiments of the present invention. In this example, the data detector is divided into 11 logic regions (e.g., 420, 422), although the data detector can be divided into any number of logic regions. The logic regions can be of roughly equal sizes or percentages of the logic circuits in the data detector, or can be of unequal sizes. For example, in some embodiments the logic regions are divided into regions of roughly equal logic depth, such as 11 logic regions each of about 9 percent of the total logic in the detector. By dividing the detector into multiple logic regions and gating or enabling the clock signal to each logic region at a different time, a more gradual ramp up of the detector is enforced to smooth out the transient IR voltage drop. The detector clock pipelines are thus spread over a larger time span with a controlled clock count for each stage or logic region. The detector processes a small amount of dummy data during the power ramp up so that power to each logic region turns on when its clock signal is enabled.

For example, as shown in FIG. 4, the normal start point 404 for the detector is moved to an earlier point 402 by gradually powering up the logic regions in the detector in a ramp up time region before the data region. In some embodiments, the logic regions are selected based on when data flows through the pipeline of flip flops and logic circuits in the detector. Data is provided first to the first logic region (e.g., 420) and flows through the data detector, being processed last in the last logic region. In such embodiments, the power ramping can overlap normal data processing as shown in FIG. 4, where power is ramped up to the first logic region with dummy data in a ramp up period 410, and user data can begin to be processed in the first logic region in a data region 412 before the ramp up period begins in later logic regions of the detector. Similarly, power is ramped down in a ramp down period 414 that reaches logic regions in stages. For example, the first logic region 420 is a first data processing stage that includes a number of flip flops that receive a data input, process the data and pass the output to the next processing stage in the second logic region 422. The clock signal to the flip flops in the first logic region 420 is enabled during the ramp up period for the first logic region 420, but the transitioning clock signal alone will not cause power to be consumed or turned on in the first logic region 420 unless the data input to the first logic region 420 is transitioning or toggling, causing the clock signals to clock the toggling data into the flip flops to change the state of the flip flops. The amount of dummy data provided to each logic region is based on the ramp up period for the logic region. For example, if the logic region is ramped up within 100 clock cycles, 100 clock cycles worth of dummy data are provided to the logic region.

The delay 424 between power up of each logic region can be programmed or hardwired. The delay 426 between power down of each logic region can also be independently programmed or hardwired in some embodiments.

Turning to FIG. 5, an example power ramp up and ramp down for a data decoder divided into a number of logic regions is depicted in accordance with one or more embodiments of the present invention. In this example, the data decoder is divided into 7 logic regions (e.g., 520, 522), although the data decoder can be divided into any number of logic regions. The logic regions can be of roughly equal sizes or percentages of the logic circuits in the data decoder, or can be of unequal sizes. For example, in some embodiments the logic regions are divided into regions of roughly equal logic depth, such as 7 logic regions each of about 14 percent of the total logic in the decoder. By dividing the decoder into multiple logic regions and gating or enabling the clock signal to each logic region at a different time, a more gradual ramp up of the decoder is enforced to smooth out the transient IR voltage drop. The decoder clock pipelines are thus spread over a larger time span with a controlled clock count for each stage or logic region. The decoder processes a small amount of dummy data during the power ramp up so that power to each logic region turns on when its clock signal is enabled.

For example, as shown in FIG. 5, the normal start point 504 for the decoder is moved to an earlier point 502 by gradually powering up the logic regions in the decoder in a ramp up time region before the data region. A ramp up period 506 during which dummy data is processed precedes a data region in which user data is decoded, followed by a ramp down period 512. Notably, ramp down may not be needed or applicable to all logic regions of the data decoder, based upon the architecture of the decoder and how data blocks are processed in the decoder. The delay 514 between power up of each logic region can be programmed or hardwired. The delay 516 between power down of each logic region can also be independently programmed or hardwired in some embodiments.

Figure 6:
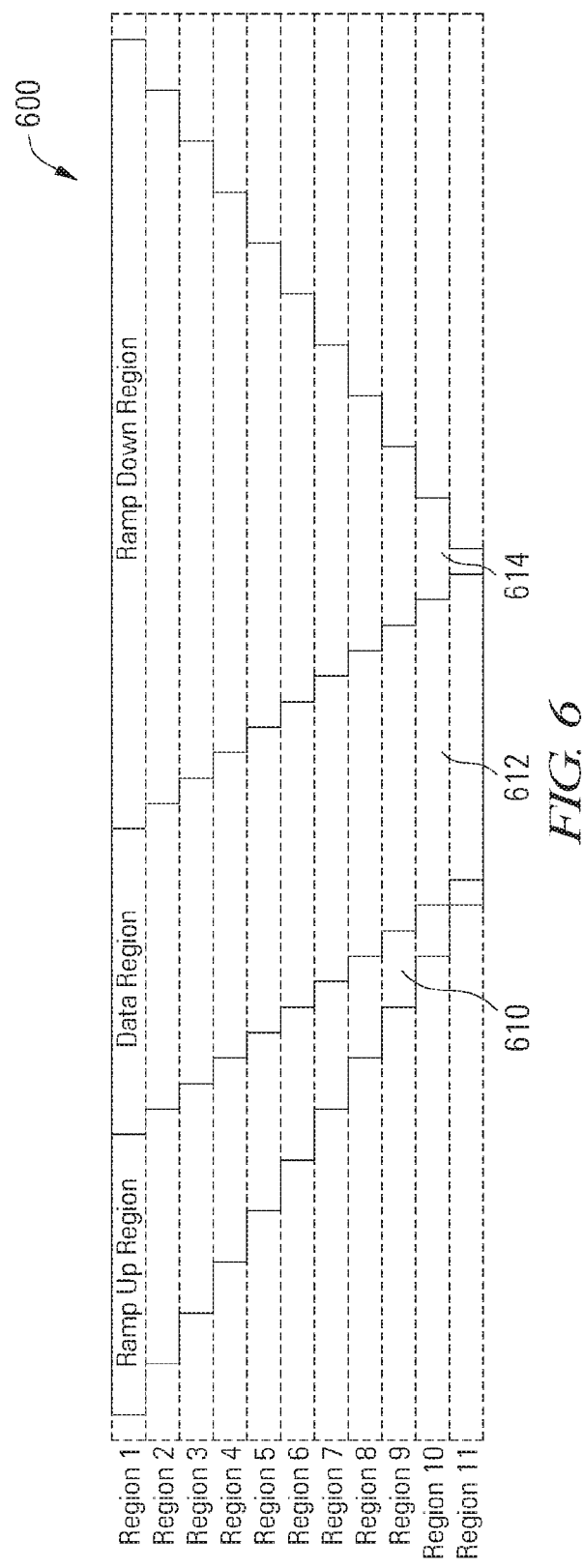
FIG. 6 depicts another power ramp up and ramp down for a data detector and/or data decoder divided into a number of logic regions in accordance with one or more embodiments of the present invention.

Turning to FIG. 6, another example power ramp up and ramp down for a data detector and/or data decoder that is divided into a number of logic regions is depicted in accordance with one or more embodiments of the present invention. The duration and shape of power up ramps and power down ramps in a detector or decoder can be adapted in any suitable manner according to the design and operation of the detector or decoder. For example, the ladder shaped parallelogram of the data region 612 represents the operation of a detector and decoder in some embodiments, in which data flows stage by stage, with the each logic region feeding data to the next logic region in turn. The power up ramp region 610 and power down ramp region 614 in this embodiment enable dummy data from each logic region to feed the next logic region so that circuits toggle at the appropriate time in each logic region to yield the desired power ramps.

Figure 7A:
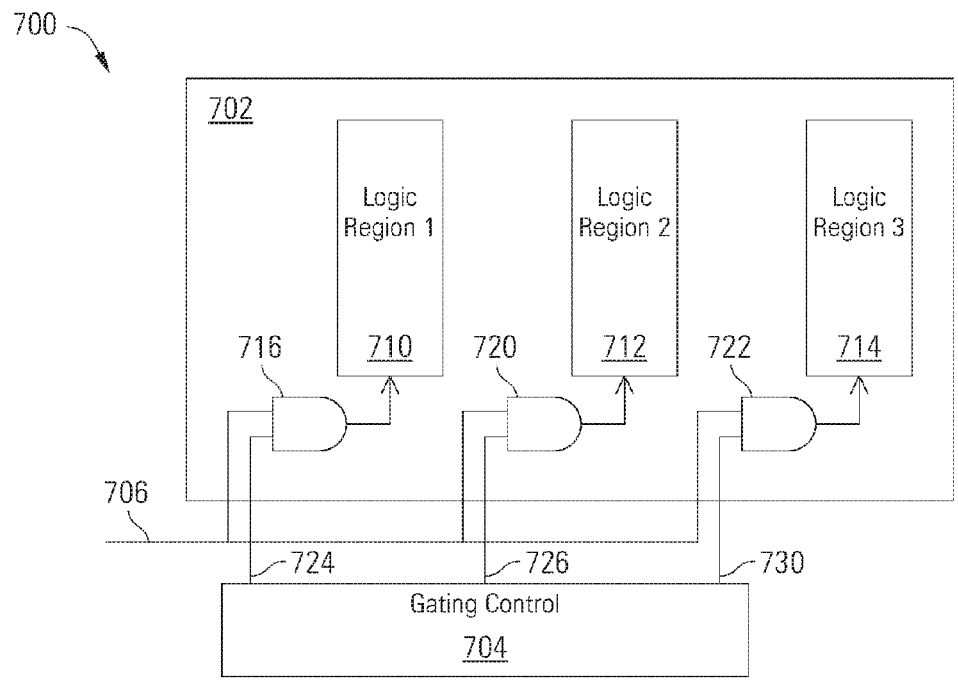
FIG. 7A depicts clock gating to logic regions in a data detector or data decoder in accordance with one or more embodiments of the present invention.

Turning to FIG. 7A, an example circuit 700 for clock gating to logic regions in a data detector or data decoder 702 is depicted in accordance with one or more embodiments of the present invention. In this example, three logic regions 710, 712, 714 are shown, although again, the data detector or data decoder 702 can be divided into any number of logic regions. A clock signal 706 to the logic regions 710, 712, 714 is gated in any suitable manner, such as, but not limited to, using AND gates 716, 720, 722 as shown in FIG. 7A. A gating control circuit 704 generates staged gating control signals 724, 726, 730 which enables the clock signal 706 to each logic region 710, 712, 714 at a different time. As clock signals to each logic region 710, 712, 714 are enabled, dummy data is provided to the logic region 710, 712, 714 during the ramp up period so that power is turned on or consumed in each logic region 710, 712, 714 as its clock signal is enabled by the gating control circuit 704. The gating control circuit 704 can be provided in the data detector or data decoder 702, in a scheduling circuit, or in any suitable location.

Notably, in some embodiments, clock gating is implemented using flip flop enable gating rather than with resistor-transistor logic. Such flip flop enable gating can be designed, for example, using clock gate cells in an electronic design tool. Based upon the disclosure provided herein, one of ordinary skill in the art will recognize a variety of clock gating techniques that can be used in relation to different embodiments of the present invention.

Figure 7B:
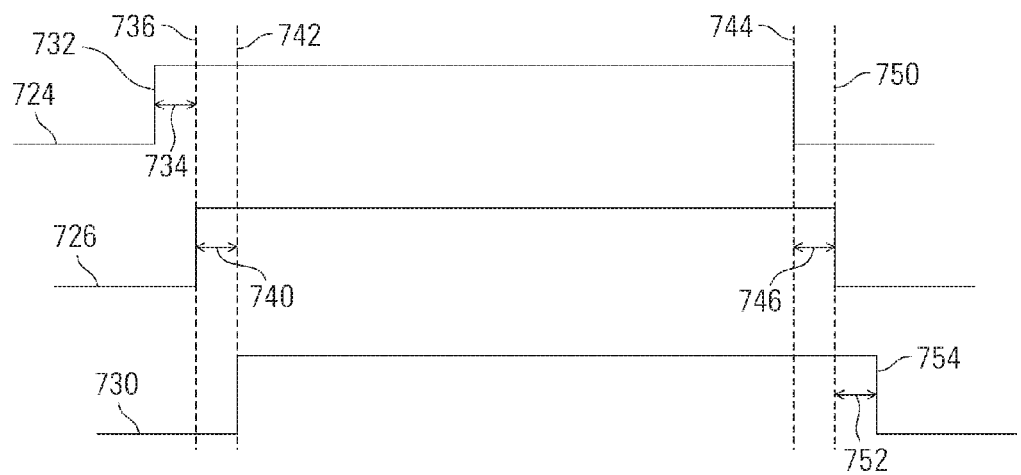
FIG. 7B is a timing diagram of clock gating signals to logic regions in a data detector or data decoder in accordance with one or more embodiments of the present invention.

The ramp up delay between enabling each of the logic regions 710, 712, 714, and the ramp down delay between disabling each of the logic regions 710, 712, 714, can be programmable or hardwired. Turning to FIG. 7B, a timing diagram depicts the clock gating signals 724, 726, 730 to each logic region in the data detector or data decoder in accordance with one or more embodiments of the present invention. The clock gating signal 724 to a first logic region 710 is enabled at a first point 732 in time as dummy data is provided to the first logic region 710. The clock gating signal 726 to the second logic region 712 is enabled at a second point 736 in time as dummy data is provided to the second logic region 712 after a programmed delay 734, which can be specified in clock cycles, multiples of bit periods, or any other suitable measure. The clock gating signal 730 to the third logic region 714 is enabled at a third point 742 in time as dummy data is provided to the third logic region 714 after a programmed delay 740. The ramp up delays (e.g., 734, 740) can be uniform or can be specified individually if desired. During the ramping down of power, the clock gating signal 724 to the first logic region 710 is disabled at a first point 744 in time. The clock gating signal 726 to the second logic region 712 is disabled at a second point 750 in time after a programmed delay 746. The clock gating signal 730 to the third logic region 714 is disabled at a third point 754 in time after a programmed delay 752. The ramp down delays (e.g., 746, 752) can be uniform or can be specified individually if desired.

Figure 8:
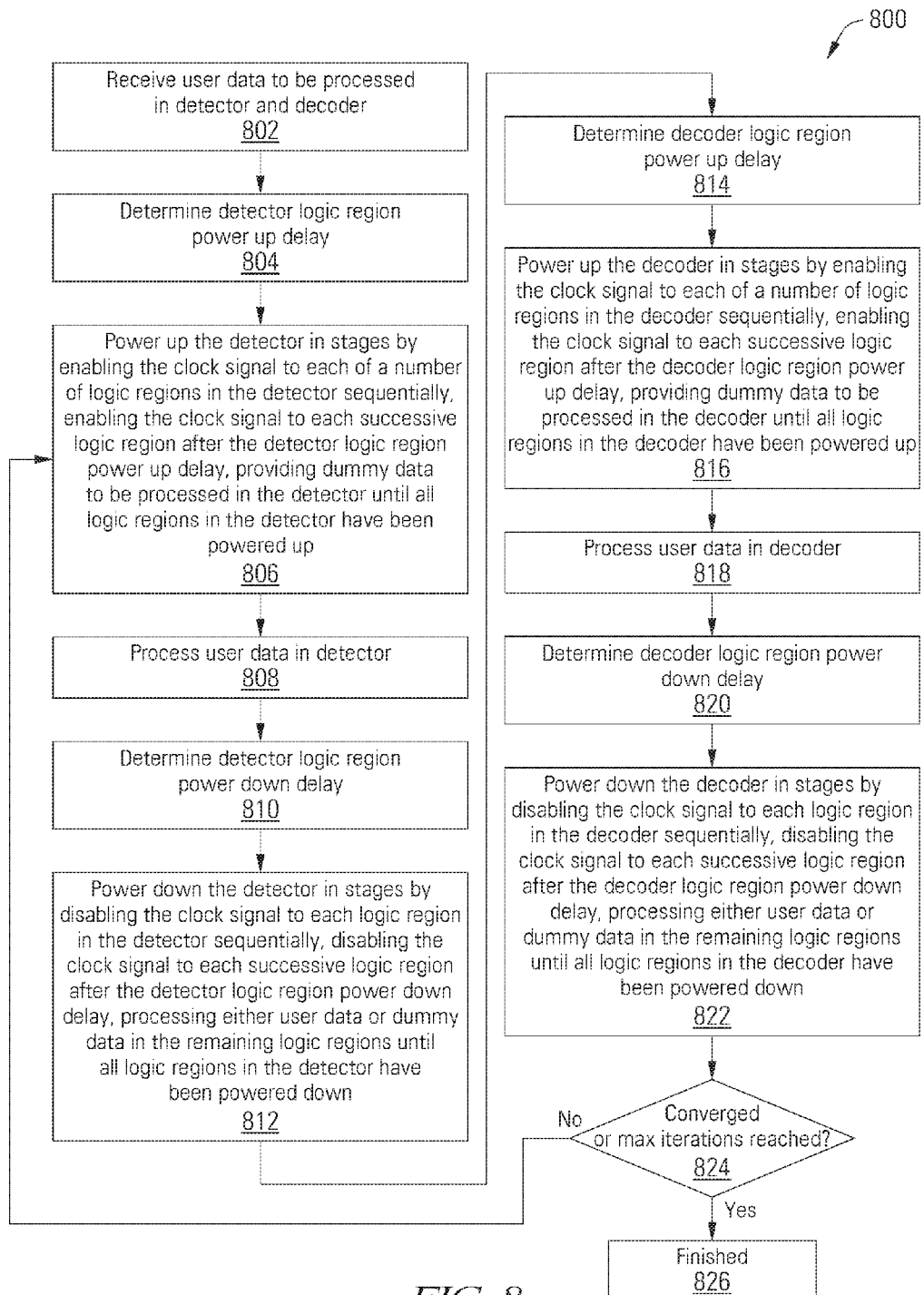
FIG. 8 is a flow diagram of a method to process data in a read channel with power ramp control in accordance with some embodiments of the present invention.

Turning to FIG. 8, a flow diagram 800 depicts a method to process data in a read channel with power ramp control in accordance with some embodiments of the present invention. Following flow diagram 800, user data to be processed in detector and decoder is received. (Block 802) Before processing data in the detector, the detector logic region power up delay is determined. (Block 804) In some embodiments, this delay between powering up of each logic region in the detector is programmable and is read, for example, from a register. The detector is powered up in stages by enabling the clock signal to each of a number of logic regions in the detector sequentially, enabling the clock signal to each successive logic region after the detector logic region power up delay, and providing dummy data to be processed in the detector until all logic regions in the detector have been powered up. (Block 806) User data is processed in the detector. (Block 808) The detector logic region power down delay is determined. (Block 810) In some embodiments, this delay between powering down of each logic region in the detector is programmable and is read, for example, from a register. The detector is powered down in stages by disabling the clock signal to each logic region in the detector sequentially, disabling the clock signal to each successive logic region after the detector logic region power down delay, and processing either user data or dummy data in the remaining logic regions until all logic regions in the detector have been powered down. (Block 812)

Before processing data in the decoder, the decoder logic region power up delay is determined. (Block 814) In some embodiments, this delay between powering up of each logic region in the decoder is programmable and is read, for example, from a register. The decoder is powered up in stages by enabling the clock signal to each of a number of logic regions in the decoder sequentially, enabling the clock signal to each successive logic region after the decoder logic region power up delay, and providing dummy data to be processed in the decoder until all logic regions in the decoder have been powered up. (Block 816) User data is processed in the decoder. (Block 818) The decoder logic region power down delay is determined. (Block 820) In some embodiments, this delay between powering down of each logic region in the decoder is programmable and is read, for example, from a register. The decoder is powered down in stages by disabling the clock signal to each logic region in the decoder sequentially, disabling the clock signal to each successive logic region after the decoder logic region power down delay, and processing either user data or dummy data in the remaining logic regions until all logic regions in the decoder have been powered down. (Block 822) A determination is made as to whether the user data codeword has converged in the decoder or whether the maximum number of detection/decoding iterations has been reached. (Block 824) If so, data processing is finished. (Block 826) Otherwise, the detection/decoding process is continued. (Block 806)

Again, the dummy data in some embodiments comprises toggling or alternating data values, causing flip flops receiving the dummy data to turn on or be activated at clock transitions. This causes the flip flops to consume power and effectively to be turned on, so that power to each logic region can be gradually turned on and off, ramping up and down power consumption in the data detector or data decoder. The dummy data can be provided in any suitable manner, such as, but not limited to, using a linear feedback shift register to shift dummy data into the detector, and a memory initialized with dummy data for the data decoder to read and process during ramped power up and, in some cases, during ramped power down. The dummy data can be provided in any suitable format, such as, but not limited to, binary data bits or non-binary data symbols in either hard decision format or soft information format, in which possible values of each data bit or symbol are represented by likelihood values such as log likelihood ratios. Based upon the disclosure provided herein, one of ordinary skill in the art will recognize a variety of dummy data sources and formats that can be used in relation to different embodiments of the present invention. In some embodiments, dummy data is processed both during ramped power up and ramped power down. In some embodiments, dummy data is processed both during ramped power up and real data is processed during ramped power down. In some such cases, once normal processing of real data (e.g., codewords representing user data) is complete, the results are output, and the real data continues to be processed in the regions of the data detector or data decoder during the ramped power down as the clock signal to various logic regions of the data detector or data decoder is gated off in staged fashion.

The delay periods can be checked once, or each time power up/power down is performed in the data detector and data decoder. The delay periods can be programmed once at system initialization, or can be dynamically changed at any time. In some other embodiments, the delay periods are hard wired in the system.

Ramping up and down of power in the data detector and data decoder can be independent, and they can operate partially or fully in parallel in some embodiments as multiple data sectors or other data blocks are processed iteratively in the data detector and data decoder. Thus, the flow diagram 800 should not be interpreted as limiting the order of processing steps in the data detector and data decoder.

Figure 9:
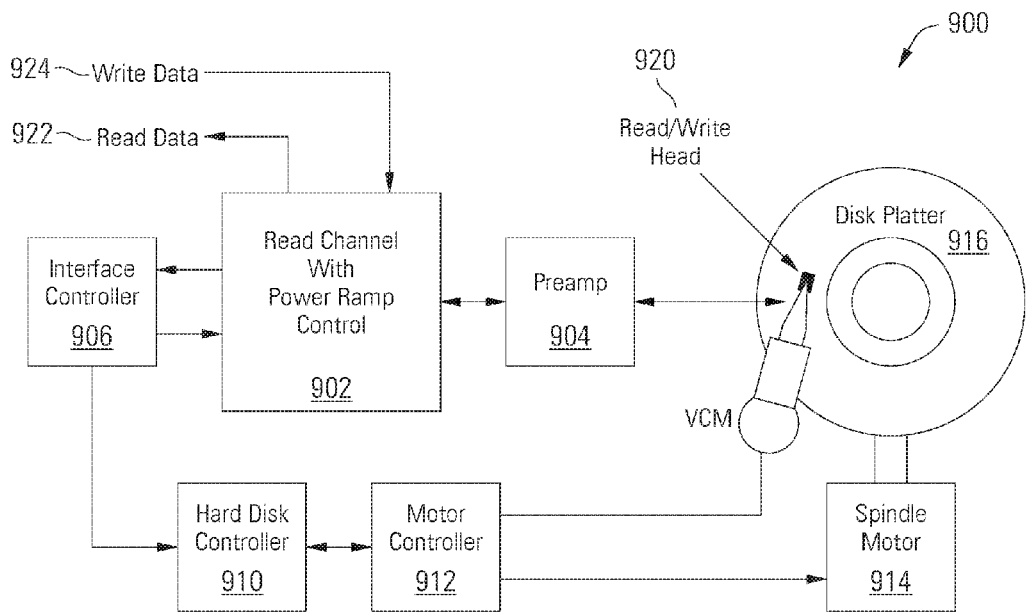
FIG. 9 depicts a storage system with a read channel including a data detector and data decoder with power ramp control in accordance with one or more embodiments of the present invention.

Turning to FIG. 9, a storage system 900 is depicted with a read channel with power ramp control in accordance with some embodiments of the present invention. Storage system 900 may be, for example, a hard disk drive. Storage system 900 also includes a preamplifier 904, an interface controller 906, a hard disk controller 910, a motor controller 912, a spindle motor 914, a disk platter 916, and a read/write head assembly 920. Interface controller 906 controls addressing and timing of data to/from disk platter 916. The data on disk platter 916 consists of groups of magnetic signals that may be detected by read/write head assembly 920 when the assembly is properly positioned over disk platter 916. In one embodiment, disk platter 916 includes magnetic signals recorded in accordance with either a longitudinal or a perpendicular recording scheme.

In a typical read operation, read/write head assembly 920 is accurately positioned by motor controller 912 over a desired data track on disk platter 916. Motor controller 912 both positions read/write head assembly 920 in relation to disk platter 916 and drives spindle motor 914 by moving read/write head assembly 920 to the proper data track on disk platter 916 under the direction of hard disk controller 910. Spindle motor 914 spins disk platter 916 at a determined spin rate (RPMs). Once read/write head assembly 920 is positioned adjacent the proper data track, magnetic signals representing data on disk platter 916 are sensed by read/write head assembly 920 as disk platter 916 is rotated by spindle motor 914. The sensed magnetic signals are provided as a continuous, minute analog signal representative of the magnetic data on disk platter 916. This minute analog signal is transferred from read/write head assembly 920 to read channel circuit 902 via preamplifier 904. Preamplifier 904 is operable to amplify the minute analog signals accessed from disk platter 916. In turn, read channel circuit 902 digitizes and decodes the received analog signal to recreate the information originally written to disk platter 916, using a data detector and data decoder, one or both of which being configured with power ramp control as disclosed herein. As the values of the data are detected in the data detector and decoded in the data decoder, power is gradually ramped up before processing in the data detector and data decoder before they process data, and gradually ramped down after processing. The ramp time is programmable in some embodiments, in some cases enabling the ramp up time and the ramp down time to be independently controlled in each of the data detector and data decoder. This data is provided as read data 922 to a receiving circuit. A write operation is substantially the opposite of the preceding read operation with write data 924 being provided to read channel circuit 902.

It should be noted that storage system 900 can be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 900, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 900 can be modified to include solid state memory that is used to store data in addition to the storage offered by disk platter 916. This solid state memory may be used in parallel to disk platter 916 to provide additional storage. In such a case, the solid state memory receives and provides information directly to read channel circuit 902. Alternatively, the solid state memory can be used as a cache where it offers faster access time than that offered by disk platter 916. In such a case, the solid state memory can be disposed between interface controller 906 and read channel circuit 902 where it operates as a pass through to disk platter 916 when requested data is not available in the solid state memory or when the solid state memory does not have sufficient storage to hold a newly written data set. Based upon the disclosure provided herein, one of ordinary skill in the art will recognize a variety of storage systems including both disk platter 916 and a solid state memory that can be used in relation to various embodiments of the invention.

Figure 10:
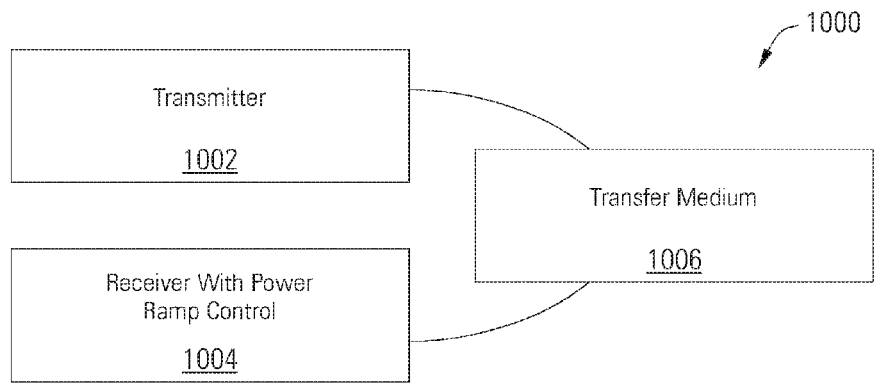
FIG. 10 depicts a wireless communication system with a receiver including a data detector and data decoder with power ramp control in accordance with one or more embodiments of the present invention.

Turning to FIG. 10, a wireless communication system 1000 or data transmission device including a receiver 1004 with a data processing system with power ramp control is shown in accordance with some embodiments of the present invention. The transmitter 1002 is operable to encode data and to transmit the encoded data via a transfer medium 1006. The encoded data is received from transfer medium 1006 by receiver 1004. Receiver 1004 incorporates a data processing system with a data detector and/or data decoder with power ramp control as disclosed above. As the values of the data are detected in the data detector and decoded in the data decoder, power is gradually ramped up before processing in the data detector and data decoder before they process data, and gradually ramped down after processing. The ramp time is programmable in some embodiments, in some cases enabling the ramp up time and the ramp down time to be independently controlled in each of the data detector and data decoder.

Figure 11:
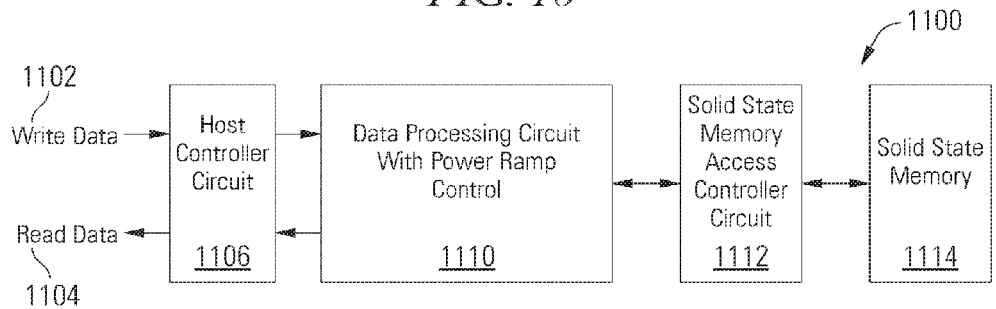
FIG. 11 depicts another storage system including a data processing circuit including a data detector and data decoder with power ramp control in accordance with one or more embodiments of the present invention.

Turning to FIG. 11, another storage system 1100 is shown that includes a data processing circuit 1110 having with power ramp control in accordance with one or more embodiments of the present invention. A host controller circuit 1106 receives data to be stored (i.e., write data 1102). This data is provided to data processing circuit 1110 where it is encoded. The encoded data is provided to a solid state memory access controller circuit 1112. Solid state memory access controller circuit 1112 can be any circuit known in the art that is capable of controlling access to and from a solid state memory. Solid state memory access controller circuit 1112 formats the received encoded data for transfer to a solid state memory 1114. Solid state memory 1114 can be any solid state memory known in the art. In some embodiments of the present invention, solid state memory 1114 is a flash memory. Later, when the previously written data is to be accessed from solid state memory 1114, solid state memory access controller circuit 1112 requests the data from solid state memory 1114 and provides the requested data to data processing circuit 1110. In turn, data processing circuit 1110 detects values in the received data and decodes the received data using a data detector and/or data decoder with power ramp control as disclosed above. The decoded data is provided to host controller circuit 1106 where it is passed on as read data 1104.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that some functions of the blocks, systems or circuits discussed herein may be implemented in either software or firmware. In some such cases, a part of a given system, block or circuit may be implemented in software or firmware, while other parts are implemented in hardware.

In conclusion, embodiments of the present invention provide novel systems, devices, methods and arrangements for power ramp control in a data processing system. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus for processing data, comprising:
   a data processing circuit configured to process user data, wherein the data processing circuit comprises a plurality of sub-circuits;
   a plurality of clock gates each configured to control a clock signal to one of the plurality of sub-circuits;
   a gating control circuit configured to control the plurality of clock gates to apply the clock signal to each of the plurality of sub-circuits in staged fashion during a ramped power up operation; and
   a dummy data source configured to provide dummy data to the data processing circuit during the ramped power up operation of the data processing circuit.

2. The apparatus of claim 1, wherein the gating control circuit comprises a ramp up programming input, and wherein the gating control circuit is configured to control a number of clock cycles applied to the plurality of sub-circuits during the ramped power up operation based on a value at the ramp up programming input.

3. The apparatus of claim 1, wherein the gating control circuit comprises a ramp down programming input, and wherein the gating control circuit is configured to control a number of clock cycles applied to the plurality of sub-circuits during a ramped power down operation based on a value at the ramp down programming input.

4. The apparatus of claim 1, wherein the data processing circuit comprises a maximum a priori data detector.

5. The apparatus of claim 4, wherein the dummy data source comprises a shift register configured to apply a dummy data pattern to the maximum a priori data detector during the ramped power up operation.

6. The apparatus of claim 1, wherein the data processing circuit comprises a low density parity check decoder.

7. The apparatus of claim 6, wherein the dummy data source comprises a memory circuit at an input to the low density parity check decoder, configured to store a dummy data pattern to the low density parity check decoder during the ramped power up operation.

8. The apparatus of claim 1, wherein the data processing circuit comprises a data detector and a data decoder, and wherein the gating control circuit and the dummy data source comprises an independent gating control circuit and an independent dummy data source for each of the data detector and the data decoder, and wherein the ramped power up operation is operable to ramp power up independently in the data detector and the data decoder.

9. A data processing system comprising:
   means for processing user data;
   means for enabling clock signals to each of a plurality of logic regions in the means for processing user data during a power ramp up period and a power ramp down period in the means for processing user data; and
   means for providing dummy data with alternating values to the means for processing user data during the power ramp up period.

10. The data processing system of claim 9, wherein the means for processing user data comprises a maximum a posteriori detector.

11. The data processing system of claim 9, wherein the means for processing user data comprises a low density parity check decoder.

* * * * *